(12) United States Patent
Nagatomi et al.

(10) Patent No.: US 7,345,418 B2
(45) Date of Patent: Mar. 18, 2008

(54) PHOSPHOR MIXTURE AND LIGHT EMITTING DEVICE USING THE SAME

(75) Inventors: Akira Nagatomi, Tokyo (JP); Masahiro Gotoh, Tokyo (JP); Kenji Sakane, Tokyo (JP)

(73) Assignee: Dowa Mining Co., Ltd., Tokyo (JP)

( * ) Notice: Subject to any disclaimer, the term of this patent is extended or adjusted under 35 U.S.C. 154(b) by 157 days.

(21) Appl. No.: 10/984,772

(22) Filed: Nov. 10, 2004

(65) Prior Publication Data

US 2006/0045832 A1    Mar. 2, 2006

(30) Foreign Application Priority Data

Aug. 27, 2004    (JP)    ............... 2004-249253

(51) Int. Cl.
*H01J 1/62* (2006.01)
*H01J 63/04* (2006.01)

(52) U.S. Cl. ............... 313/503; 313/498; 252/301.4 R; 252/301.4 F

(58) Field of Classification Search ............ 313/498, 313/502–504, 512; 257/98–100; 252/301.4 R, 252/301.4 F
See application file for complete search history.

(56) References Cited

U.S. PATENT DOCUMENTS

| | | | |
|---|---|---|---|
| 18,985 A | 12/1857 | Olds | |
| 2,121,275 A | 6/1938 | Zober et al. | |
| 3,527,595 A | 9/1970 | Adler et al. | |
| 4,477,689 A | 10/1984 | Ogasahara et al. | |
| 4,576,736 A | 3/1986 | Harmuth | |
| 5,398,398 A | 3/1995 | Williams et al. | |
| 5,447,291 A | 9/1995 | Sandhage | |
| 6,670,748 B2 | 12/2003 | Ellens et al. | |

(Continued)

FOREIGN PATENT DOCUMENTS

EP    0 459 156 A2    4/1991

(Continued)

OTHER PUBLICATIONS

JIS Z 8726; "Method of Specifying Colour Rendering Properties of Light Sources"; (1990).

(Continued)

*Primary Examiner*—Nimeshkumar D. Patel
*Assistant Examiner*—Kevin Quarterman
(74) *Attorney, Agent, or Firm*—Oliff & Berridge, PLC

(57) ABSTRACT

A phosphor mixture containing four or more kinds of phosphors including a red phosphor, an orange phosphor, a blue phosphor, and a green phosphor, to produce emission having excellent color rendering of white light at a high color temperature, and emission in warm white which is low in color temperature, and a light emitting device including the phosphor mixture and a light-emitting section, $CaAlSiN_3$:Eu and $CaAl_2Si_4N_8$:Eu are manufactured as a red phosphor and an orange phosphor respectively, and ZnS:Cu, Al, and BAM:Eu are prepared as a green phosphor and a blue phosphor respectively. The emission spectrums of these phosphors are measured and a relative mixing ratio at which the correlated color temperature of the phosphor mixture becomes a targeted color temperature is determined from the emission spectrum by simulation, and a phosphor mixture is obtained by weighing and mixing the respective phosphors based on the simulation result.

18 Claims, 5 Drawing Sheets

U.S. PATENT DOCUMENTS

| | | |
|---|---|---|
| 7,138,756 B2 | 11/2006 | Gotoh et al. |
| 2002/0043926 A1 | 4/2002 | Takahashi et al. |
| 2003/0030368 A1 | 2/2003 | Ellens et al. |
| 2003/0094893 A1 | 5/2003 | Ellens et al. |
| 2003/0132422 A1 | 7/2003 | Tian et al. |
| 2003/0152804 A1 | 8/2003 | Miura et al. |
| 2003/0213611 A1 | 11/2003 | Morita |
| 2004/0155225 A1 | 8/2004 | Yamada et al. |
| 2004/0263074 A1 | 12/2004 | Baroky et al. |
| 2005/0001225 A1 | 1/2005 | Yoshimura et al. |
| 2005/0189863 A1 | 9/2005 | Nagatomi et al. |
| 2005/0203845 A1 | 9/2005 | Yoshimine et al. |
| 2005/0205845 A1 | 9/2005 | Deising et al. |
| 2005/0253500 A1 | 11/2005 | Gotoh et al. |
| 2005/0267243 A1 | 12/2005 | Amasaki et al. |
| 2006/0006782 A1 | 1/2006 | Nagatomi et al. |
| 2006/0017365 A1 | 1/2006 | Nagatomi et al. |
| 2006/0021788 A1 | 2/2006 | Kohayashi et al. |
| 2006/0022573 A1 | 2/2006 | Gotoh et al. |
| 2006/0033083 A1 | 2/2006 | Sakane et al. |
| 2006/0043337 A1 | 3/2006 | Sakane et al. |
| 2006/0045832 A1 | 3/2006 | Nagatomi et al. |
| 2006/0065878 A1 | 3/2006 | Sakane et al. |
| 2006/0076883 A1 | 4/2006 | Himaki et al. |
| 2006/0091790 A1 | 5/2006 | Nagatomi et al. |
| 2006/0170332 A1* | 8/2006 | Tamaki et al. ............. 313/498 |
| 2006/0197432 A1 | 9/2006 | Nagatomi et al. |
| 2006/0197439 A1 | 9/2006 | Sakane et al. |
| 2006/0220047 A1 | 10/2006 | Nagatomi et al. |
| 2006/0220520 A1 | 10/2006 | Sakane et al. |
| 2006/0244356 A1 | 11/2006 | Nagatomi et al. |
| 2007/0007494 A1 | 1/2007 | Hirosaki et al. |
| 2007/0164308 A1 | 7/2007 | Yoshimura et al. |

FOREIGN PATENT DOCUMENTS

| | | |
|---|---|---|
| EP | 1 296 376 A2 | 3/2003 |
| EP | 1 445 295 A1 | 8/2004 |
| JP | 05-015655 | 1/1993 |
| JP | 05-198433 | 8/1993 |
| JP | 11-144938 | 5/1999 |
| JP | 11-277527 | 10/1999 |
| JP | 2000-073053 | 3/2000 |
| JP | 2000-153167 | 6/2000 |
| JP | 2001-214162 | 8/2001 |
| JP | 2002-363554 | 12/2002 |
| JP | 2003-013059 | 1/2003 |
| JP | 2003-096446 | 4/2003 |
| JP | A-2003-124527 | 4/2003 |
| JP | A-2003-515655 | 5/2003 |
| JP | A-2003-277746 | 10/2003 |
| JP | 2003-336059 | 11/2003 |
| JP | 2004-055910 | 2/2004 |
| JP | 2004-505470 | 2/2004 |
| JP | A-2004-505470 | 2/2004 |
| JP | 2004-067837 | 3/2004 |
| JP | A-2004-145718 | 5/2004 |
| JP | 2004-166058 | 6/2004 |
| JP | 2004-189997 | 7/2004 |
| JP | 2004-207271 | 7/2004 |
| JP | A-2004-186278 | 7/2004 |
| JP | 2004-235598 | 8/2004 |
| JP | 2004-248405 | 8/2004 |
| JP | 2004-250920 | 8/2004 |
| JP | 2004-253312 | 8/2004 |
| JP | 2004-244560 | 9/2004 |
| JP | 2004-055536 | 12/2004 |
| JP | 2004-368153 | 12/2004 |
| JP | 2005-075854 | 3/2005 |
| JP | 2005-103429 | 3/2005 |
| JP | 2005-105126 | 3/2005 |
| JP | 2005-192691 | 6/2005 |
| JP | 2005-344025 | 12/2005 |
| JP | 2006-028295 | 2/2006 |
| JP | 2006-063214 | 3/2006 |
| JP | 2006-063286 | 3/2006 |
| JP | 2006-070109 | 3/2006 |
| JP | 2006-176546 | 7/2006 |
| WO | WO 01/40403 A1 | 6/2001 |
| WO | WO 02/11214 A1 | 2/2002 |
| WO | WO 2004/030109 A1 | 4/2004 |
| WO | WO 2004/039915 A1 | 5/2004 |
| WO | WO 2004/055910 A1 | 7/2004 |
| WO | WO 2005/052087 A1 | 6/2005 |

OTHER PUBLICATIONS

U.S. Appl. No. 11/061,669, filed Feb. 22, 2005, Nagatomi et al.
U.S. Appl. No. 11/063,847, filed Feb. 23, 2005, Sakane et al.
U.S. Appl. No. 11/149,317, filed Jun. 10, 2005, Nagatomi et al.
U.S. Appl. No. 11/149,192, filed Jun. 10, 2005, Sakane et al.
U.S. Appl. No. 11/198,281, filed Aug. 8, 2005, Nagatomi et al.
U.S. Appl. No. 11/194,590, filed Aug. 2, 2005, Gotoh et al.
U.S. Appl. No. 11/211,751, filed Aug. 26, 2005, Sakane et al.
U.S. Appl. No. 11/218,504, filed Sep. 6, 2005, Nagatomi et al.
"Phosphor Handbook"; (compiled by Phosphor Research Society, published by Ohmusha, Ltd., 1987); pp. 172-176.
U.S. Appl. No. 11/194,590, filed Aug. 2, 2005.
K. Uheda et al., "The Crystal Structure and Photoluminescence Properties of a New Red Phosphor, Calcium Aluminum Silicon Nitride Doped With Divalent Euroium," Abs. 2073, 206th Meeting., Oct. 3, 2004.

* cited by examiner (A)

(B)

(C)

PHOSPHOR MIXTURE AND LIGHT EMITTING DEVICE USING THE SAME

BACKGROUND OF THE INVENTION

1. Field of the Invention

The present invention relates to a phosphor mixture used for an illumination device and the like such as a light-emitting diode (LED), a vacuum fluorescent display, a fluorescent lamp, and the like, and an light emitting device using the phosphor mixture.

2. Description of the Relevant Art

As a light emitting device which has been conventionally used for an illumination device, a discharge-type fluorescent lamp, an incandescent lamp and the like can be cited. However, a light-emitting diode emitting a white light has been recently developed. The white LED illumination is an ideal illumination device having such merits of lower heat generation, better luminous efficacy, and lower power consumption compared to a conventional light source for illumination, and a long life without burnt-out of a filament like a conventional incandescent lamp because it is formed of only a semiconductor or a semiconductor and phosphor, and not requiring harmful material such as mercury which are maleficent to the environment but are essential to a conventional fluorescent lamp.

As necessary factors in a light source for general-purpose illumination including the white LED described above, color rendering can be cited as well as brightness. The color rendering is a value indicating reproducibility of color depending on a light source, and JIS Z 8726 (1990) is generally used for an evaluation method of the color rendering. Consequently, explanation will be made from now on based on the evaluation method of JIS Z 8726.

According to JIS Z 8726, the color rendering of a light source is expressed numerically by a general color rendering index (Ra). This is an index to evaluate difference in color between a reference sample for evaluating color rendering illuminated by a sample light source in test and the reference sample illuminated by a reference light close to a natural light. If both are identical without any difference, the color rendering index is 100. Even when color temperatures of a light source, are identical, color is seen differently depending on a color rendering index, and if the color rendering index is low, the color looks dull and dark. If a light source has the more uniform light intensity over the entire visible light region, the light source can be said to have a good color rendering.

The white LED becoming popular as a general-purpose illumination is generally an LED light source which emits light appearing white when seen by human eyes by synthesizing blue emitting light and yellow emitting light by combining a blue light emitting LED and a yellow light emitting phosphor excited by receiving the blue light thus emitted. However, since this type is composed of blue emitting light and yellow emitting light, it presents a problem that green and red which are required for a light source for illumination is extremely weak. Especially, a color component for a long-wavelength side or red in the visible light region is insufficient, which results in emitting a slightly bluish white light though it is still in white zone so far. Accordingly, when this white LED is used for a general-purpose illumination, a red object appears to be very dull red, which means color rendering of this light source is very unfavorable. Furthermore, as it has no red light-emission component, it is impossible to obtain reddish white emitting-light like warm white at a correlated color temperature of 4000 K or less.

A white LED for obtaining a white emitting-light from light in RGB etc. by combing an LED emitting a near-ultraviolet or ultraviolet light and a phosphor emitting a red light (R), a phosphor emitting a green light (G), a phosphor emitting a blue light (B), and phosphors emitting other colors excited by receiving the above-described near-ultraviolet or ultraviolet emitting-light has been developed to improve the above-described color rendering of white LED. It is possible for the white LED which obtains a white light from lights of the respective RGB phosphors to obtain an arbitrary light including a white light by combination or combination ratio of RGB phosphors. Besides, since the wavelength of the obtained emitting light contains almost all regions in the visible light region, it is possible to enhance the color rendering.

Existent phosphors have been studied to utilize as a phosphor in RGB and others used for this usage. For a red phosphor, there are, for instance, $Y_2O_2S:Eu$, $La_2O_2S:Eu$, $3.5MgO.0.5MgF_2.GeO_2:Mn$, $(La, Mn, Sm)_2O_2S.Ga_2O_3:Eu$, SrS:Eu, CaS:Eu. For a green phosphor, there are, for instance, ZnS:Cu,Al, ZnS:Cu, $SrAl_2O_4:Eu$, BAM:Eu,Mn, $(Ba, Sr, Ca)_2SiO_4:Eu$. For a yellow phosphor, there is, for instance, YAG:Ce, and for a blue phosphor, there are, for instance, BAM:Eu ($BaMgAl_{10}O_{17}:Eu$), ZnS:Ag, $(Sr, Ca, Ba, Mg)_{10}(PO_4)_6Cl_2:Eu$. Researches to obtain a light source or an illumination device including an LED producing light of white or other desired colors by combining phosphors such as these RGB or others with a light-emitting section such as an LED emitting light in near-ultraviolet/ultraviolet have been carried out.

However, in white LED illumination by combination of a near-ultraviolet/ultraviolet LED and a phosphor in RGB or others, there is a problem that a red phosphor among RGB phosphors is especially low in emission efficiency compared with phosphors in other colors. Accordingly, when manufacturing a white LED, mixing ratio of the red phosphor is required to be extremely high compared with phosphors in other colors among the mixing ratio of the phosphors, which results in reduction of mixing ratios of the phosphors in other colors, so that a white color in high luminance cannot be obtained. Especially, as for a white LED requiring a light having a low color temperature such as warm white in which a mixing ratio of a long wavelength side (red color side) component is high, a necessary amount of a red phosphor is further increased, which causes a more pronounced problem that emission with high luminance as a whole cannot be obtained Therefore, in recent years, in order to solve the problem that exciting efficiency on a long wavelength side of the red phosphor described above is low compared with phosphors in other colors, a phosphor containing nitrogen such as silicon nitride series or the like is reported as a red phosphor which has a favorable excitation band on the long wavelength side, and can obtain a fluorescence peak having a wide half band width. The present inventors also propose Japanese Patent Publication Laid-open No. 2004-145718 (refer to Patent Documents 1 to 4). Light emitting devices which are improved in color rendering by combining light emitted from a blue LED and an emission of a yellow phosphor represented by YAG or the like, and an emission of a red phosphor containing above-described nitrogen or by combining a near-ultraviolet/ultraviolet LED with blue and green phosphors and a red phosphor containing above-described nitrogen are proposed (refer to Patent Documents 5 and 6).

(Patent Document 1) Translated National Publication of Patent Application No. 2003-515655

(Patent Document 2) Japanese Patent Publication Laid-open No. 2003-277746

(Patent Document 3) Translated National Publication of Patent Application No. 2003-515655

(Patent Document 4) Japanese Patent Publication Laid-open No. 2003-124527

(Patent Document 5) Translated National Publication of Patent Application No. 2004-505470

(Patent Document 6) Patent Bulletin WO 2004/039915 A1

A white light having favorable color rendering of which color temperature exceeds 5000 K has been obtained by combining the above-described nitride series red phosphor with a blue LED and a yellow phosphor such as YAG or the like, or by combining the above-described nitride series red phosphor, a phosphor in RGB or others and a light-emitting section such as a near-ultraviolet/ultraviolet LED.

However, based on the studies by the present inventors, it becomes clear that a light having favorable color rendering cannot be obtained even by the above-described method in a region of color temperature at 4500 K or less, especially in a reddish warm white of about 3000 K in color temperature, it is found that it is impossible to obtain a light in favorable color rendering. Besides, it is found that even in a white light by combining a near-ultraviolet/ultraviolet LED with a phosphor in RGB and others, though a white light in a region with a low color temperature can be obtained by using a known red phosphor as a red emission component, a light in favorable color rendering cannot be obtained. This may be due to shortage of light in a long-wavelength side of 630 nm or more.

Then, the present inventors studied known red phosphors which emit light in a long-wavelength side of 630 nm or more. However, it was found that such red phosphors were low in emission efficiency when excited by the light of blue LED or ultraviolet LED and couldn't obtain a light having high color rendering.

It is thought that as a demand from a future market, not only in a white light in high color temperature, but also in a warm white light in low color temperature, a light source such as an LED producing various light including a white light excellent in color rendering is required. However, it was found that it was insufficient to improve the color rendering with a phosphor mixture including a red phosphor of a conventional technology.

SUMMARY OF THE INVENTION

In view of the above-described circumstances, the object of the present invention is to provide a phosphor mixture which contains four or more kinds of phosphors comprising a red phosphor, an orange phosphor, a blue phosphor, and a green phosphor, and produces emission having excellent color rendering, and a light emitting device including the above phosphor mixtures- and a light-emitting section.

Here, the present inventors studied to cope with the above subjects. First, a new red phosphor having a maximum peak of the emission spectrum (hereinafter a maximum peak of the emission spectrum is sometimes referred to as only a maximum peak) at 630 nm to 680 nm in wavelength and having an excitation band for light of a wide range of wavelengths from ultraviolet to visible light (for instance, a green light) was manufactured. And a phosphor mixture is prepared by combining at least four or more kinds of phosphors of the above-described red phosphor, an orange phosphor having similarly an excitation band for light of a wide range of wavelengths from ultraviolet to visible light (for instance, a blue light), and having a maximum peak of the emission spectrum in the wavelength range of 570 nm to 630 nm, a green phosphor having a maximum peak in the wavelength range of 500 nm to 570 nm and a blue phosphor having a maximum peak in the wavelength range of 440 nm to 500 nm. Thus, the phosphor mixture and a wide variety of light sources (for instance, a light source from an ultraviolet light to a blue light) can be combined, so that the inventors have come up with a light source capable of producing various light including a white light excellent in color rendering even at a region of a low color temperature.

In order to solve the above-described problem, a first aspect of the present invention provides a phosphor mixture, comprising:

a red phosphor expressed by a composition formula of $M_mA_aB_bO_oN_n:Z$ (where an element M indicates one or more kinds of elements having a valency of II, an element A indicates one or more kinds of elements having a valency of III, an element B indicates one or more kinds of elements having a valency of IV, O indicates oxygen, N indicates nitrogen, an element Z indicates elements serving as an activator in the above phosphors, and $m=a=b=1$, $o<0.5$, $n=3-\frac{2}{3}o$);

an orange phosphor having a maximum peak of emission spectrum in the wavelength range of 570 nm to 630 nm;

a green phosphor having a maximum peak of the emission spectrum in the wavelength range of 500 nm to 570 nm; and a blue phosphor having a maximum peak of the emission spectrum in the wavelength range of 440 nm to 500 nm.

A second aspect of the present invention provides the phosphor mixture according to the first aspect, wherein the orange phosphor is a phosphor expressed by a composition formula of $M_mA_aB_bO_oN_n:Z$ (where an element M indicates one or more kinds of elements having a valency of II, an element A indicates one or more kinds of elements having a valency of III, an element B indicates one or more kinds of elements having a valency of IV, O indicates oxygen, N indicates nitrogen, an element Z indicates elements serving as an activator in the above-described phosphors, and $n=\frac{2}{3}m+a+\frac{4}{3}b-\frac{2}{3}o$ ($m>0$, $a\geq 0$, $b>0$, $o\geq 0$)).

A third aspect of the present invention provides the phosphor mixture according to the first or second aspects, wherein the orange phosphor is a phosphor expressed by a composition formula of $M_mA_aB_bO_oN_n:Z$ (where an element M indicates elements consisting of one or more kinds of elements having a valency of II, an element A indicates one or more kinds of elements having a valency of III, an element B indicates one or more kinds of elements having a valency of IV, O indicates oxygen, N indicates nitrogen, an element Z indicates elements serving as an activator in the above-described phosphors, and $m=1.0$, $a=2.0$, $3.0\leq b\leq 6.0$, $o<1.0$, $n=\frac{8}{3}+\frac{4}{3}b-\frac{2}{3}o$).

A fourth aspect of the present invention provides the phosphor mixture according to anyone of the first to third aspects, wherein the element M comprises; one or more kinds of elements selected from Ca, Mg, Sr, Ba, and Zn;

the element A comprises one or more kinds of elements selected from Al and Ga;

the element B comprises one or more kinds of elements selected from Si and Ge; and the element Z comprises one or more kinds of elements selected from a group consisting of rare earth elements or transition metal elements.

A fifth aspect is the phosphor mixture according to anyone of first to fourth aspects, wherein the element Z comprises Eu.

A sixth aspect of the present invention provides the phosphor mixture according to anyone of the first to fifth aspects, wherein each of the respective phosphors has a half band width of 50 n m or more in the emission spectrum.

A seventh aspect is the phosphor mixture according to anyone of first to sixth aspects, wherein the phosphor mixture includes a spectrum having a correlated color temperature in the range of 7000 K to 2000 K and being continuous in the wavelength range of 420 nm to 780 nm without breaks in the emission spectrum excited by exciting light in the wavelength range of 300 nm to 420 nm.

An eighth aspect of the present invention provides the phosphor mixture according to anyone of the first to seventh aspects, wherein the phosphor mixture includes a spectrum having a correlated color temperature in the range of 4500 K to 2000 K, having three or more of emission peak in the wavelength range of 420 nm to 780 nm, and being continuous in the wavelength range of 420 nm to 780 nm without breaks in the emission spectrum excited by exciting light in the wavelength range of 300 to 420 nm.

A ninth aspect of the present invention provides the phosphor mixture according to anyone of the first to eighth aspects, wherein the green phosphor comprises ZnS:Cu, Al, and/or $(Ba, Sr, Ca)_2SiO_4$:Eu.

A tenth aspect of the present invention provides the phosphor mixture according to anyone of the first to ninth aspects, wherein the blue phosphor comprises BAM:Eu ($BaMgAl_{10}O_{17}$:Eu) and/or $(Sr, Ca, Ba, Mg)_{10}(PO_4)_6Cl_2$:Eu.

An eleventh aspect of the present invention provides the phosphor mixture according to anyone of the first to tenth aspects, wherein each of the respective phosphors comprises particles having an average particle size of 0.1 μm to 20 μm.

A twelfth aspect of the present invention provides a light emitting device, comprising:

the phosphor mixture according to anyone of first to eleventh aspects, and a light-emitting section producing light having any wavelength in the wavelength range of 300 nm to 420 nm.

A thirteenth aspect of the present invention provides the light emitting device according to the twelfth aspect, wherein the general color rendering index Ra of the light emitting device is 80 or more.

A fourteenth aspect of the present invention provides the light emitting device according to the twelfth or thirteenth aspect, wherein the special color rendering index R9 of the light emitting device is 60 or more.

A fifteenth aspect of the present invention provides the light emitting device according to anyone of the twelfth to fourteenth aspects, wherein the special color rendering index R15 of the light emitting device is 80 or more.

A sixteenth aspect of the present invention provides the light emitting device according to anyone of the twelfth to fifteenth aspects, wherein a correlated color temperature of the light emitting device is in the range of 7000 K to 2500 K.

A seventeen aspect of the present invention provides the light emitting device according to anyone of the twelfth to fifteenth aspects, wherein a correlated color temperature of the light emitting device is in the range of 4500 K to 2500 KF An eighteenth aspect is the light emitting device according to anyone of twelfth to seventeenth aspects, wherein the light-emitting section comprises a light-emitting diode (LED).

DETAILED DESCRIPTION OF THE PREFERRED EMBODIMENT(S)

Figure 1:
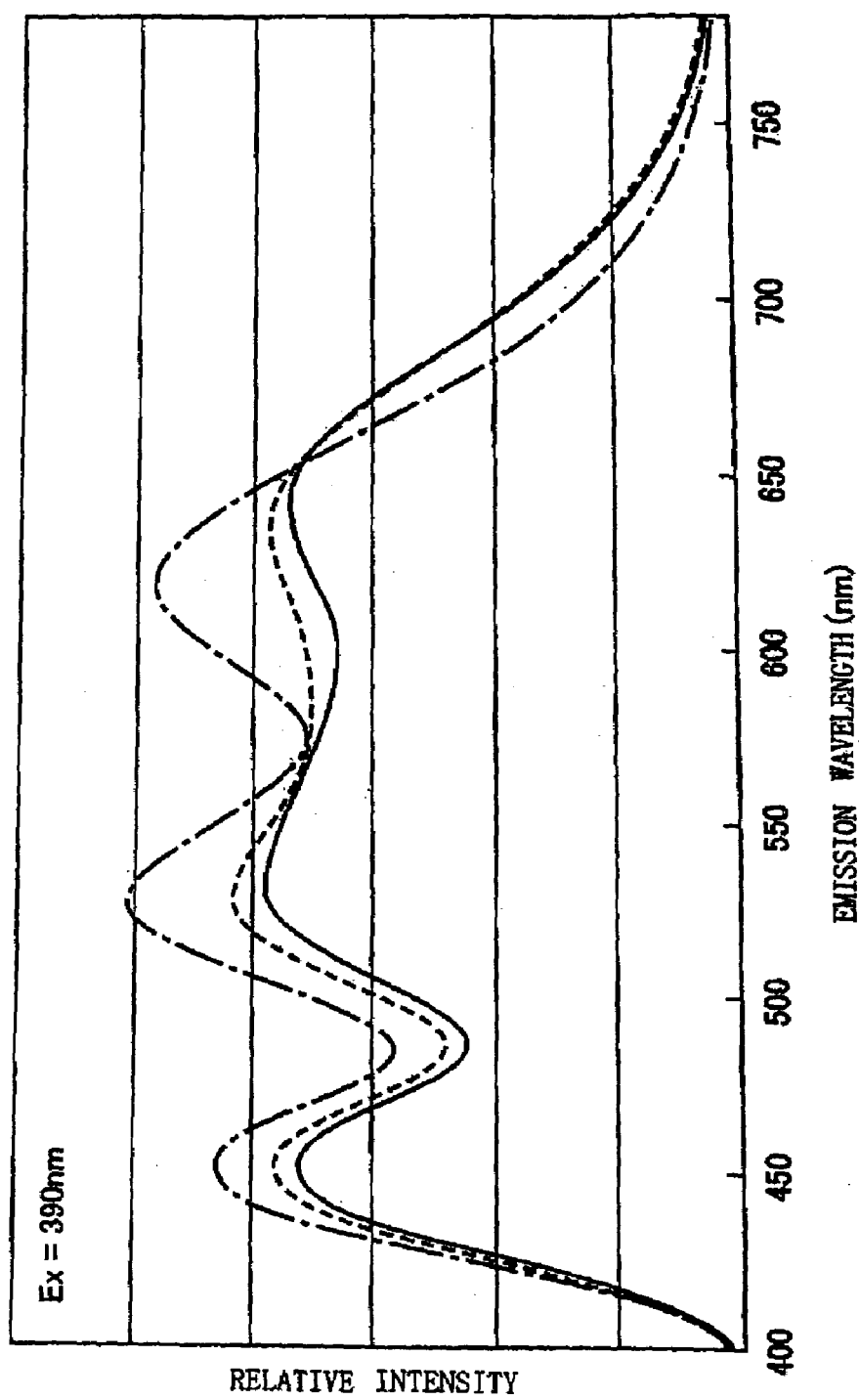
FIG. 1 shows an emission spectrum pattern of a phosphor mixture according to an embodiment, when the correlated color temperature is set to be 5000K.

A phosphor mixture according to the present invention is a phosphor mixture including a red phosphor expressed by a composition formula of $M_mA_aB_bO_oN_n$:Z (where an element M corresponds to one, or more kinds of elements having a valency of II, an element A corresponds to one or more kinds of elements having a valency of III, an element B corresponds to one or more kinds of elements having a valency of IV, N corresponds to nitrogen, O corresponds to oxygen, and an element Z corresponds to elements serving as an activator), an orange phosphor having a maximum peak of the emission spectrum in the wavelength range of 570 nm to 630 nm, a green phosphor having a maximum peak of the emission spectrum in the wavelength range of 500 nm to 570 nm, and a blue phosphor having a maximum peak of the emission spectrum in the wavelength range of 440 nm to 500 nm. The phosphor mixture having the above composition is a phosphor mixture from which can be obtained a light emitting device having a spectrum over the entire visible light region, and is excellent color rendering, especially of the red color series when emitting light by combining light in various wavelengths.

First, a red phosphor contained in the phosphor mixture relating to the present invention and expressed by a composition formula of $M_mA_aB_bO_oN_n$:Z will be explained.

In the composition formula of the red phosphor, an element M corresponds to one or more kinds of elements having a valency of II, an element A corresponds to one or more kinds of elements having a valency of III, an element B corresponds to one or more kinds of elements having a valency of IV, O corresponds to oxygen, N corresponds to nitrogen, an element Z corresponds to elements serving as an activator in the above-described phosphors, and m=a=b=1, o<0.5, n=3−⅔o). The red phosphor satisfying this formula produces bright red emission with high efficiency, having a maximum peak of the emission spectrum in the wavelength range of 630 nm to 700 nm when a light in the wavelength range of 250 nm to 550 mm is irradiated as an excitation light. The half band width of the emission spectrum is 50 nm or more.

It should be noted that O in the above-described composition formula comes from oxygen contained in the raw material of the red phosphor at the time of producing the red phosphor, and the amount of O is preferably small in view of emission efficiency of the red phosphor.

Next, an orange phosphor used together with the red phosphor will be explained.

As the orange phosphor, a phosphor expressed by a composition formula of MmAaBbOoNn:Z (where an element M corresponds to one or more kinds of elements having a valency of II, an element A corresponds to one or more kinds of elements having a valency of III, an element B corresponds to one or more kinds of elements having a valency of IV, O corresponds to oxygen, N corresponds to nitrogen, an element Z corresponds to elements serving as an activator in, the above-described phosphors, and $n=\frac{2}{3}m+a+\frac{4}{3}b-\frac{2}{3}o$ ($m>0$, $a \geq 0$, $b \geq 0$, $o \geq 0$) can orange phosphor (Ca, Sr, Ba)$_2$Si$_5$N$_8$:Eu described in Patent Document 1, and 2.75SrO·Si$_3$N$_4$:Eu described in Japanese Patent Publication Laid-open No. 2004-145718.

However, from a view point seeking for more excellent color rendering, it is preferable to use an orange phosphor expressed by a composition formula of MmAaBbOoNn:Z, where an element M corresponds to one or more kinds of elements having a valency of II, an element A corresponds to one or more kinds of elements having a valency of III, an element B corresponds to one or more kinds of elements having a valency of IV, O corresponds to oxygen, N corresponds to nitrogen, an element Z corresponds to elements serving as an activator in the above-described phosphors, and $n=\frac{8}{3}+\frac{4}{3}b-\frac{2}{3}o$ ($m=1$, $a=2$, $b=4$, $o<0.0$). The orange phosphor having this formula produces bright orange emission with high efficiency having a maximum peak of the emission spectrum in the wavelength range of 570 nm to 630 nm when a light in the wavelength range of 250 nm to 420 nm is irradiated as an excitation light. The half band width of the emission spectrum is 50 nm or more.

Here, O in the above-described composition formula comes from oxygen contained in the raw material of the orange phosphor at the time of production, similarly to the above-described red phosphor, and the amount of O is preferably small in view of emission efficiency of the orange phosphor.

Therefore, in the following explanation of the structures of the phosphor, description will be made sometimes omitting O from the composition formula.

Here, the element M, element A, element B, and element Z which are contained in the above-described red phosphor and orange phosphor will be further explained.

The element M corresponds to one or more kinds of elements having a valency of II, and preferably one or more kinds of elements selected from a group consisting of Ca, Mg, Sr, Ba, and Zn. These elements are preferable because the raw materials for these elements are easily available and environmental loads are also low. From these points of view, Ca is most preferable.

The element A corresponds to one or more kinds of elements having a valency of III, and preferably one or more kinds of elements selected from Al and Ga. Raw materials of these elements are also easily available and their environmental loads are low too. From these points of view, Al is most preferable.

The element B corresponds to one or more kinds of elements having a valency of IV, and preferably one or more kinds of elements selected from Si and Ge. Raw materials of these elements are also easily available and their environmental loads are also low. From these points of view, Si is most preferable.

The element Z is element serving as an activator, and are preferably at least one or more kinds of elements selected from rare-earth elements and transition metal elements. Raw materials of these elements are also easily available and their environmental loads are also low. From these points of view, Eu is most preferable.

The green phosphor contained in the phosphor mixture relating to the present invention will be explained next.

As for the green phosphor, a known green phosphor having an excitation characteristic and an emission characteristic which will be explained below can be used.

It is a green phosphor producing bright green emission with high efficiency having a maximum peak of an emission spectrum within the wavelength range of 500 nm to 570 nm, when a light having wavelength ranges of 250 nm to 460 nm, preferably 300 nm to 420 nm is irradiated as an excitation light. Besides, the half band width of the emission spectrum is preferably 50 nm or more.

As examples of green phosphors having the above excitation characteristic and the emission characteristic, ZnS:Cu, Al, (Ba, Sr, Ca)$_2$SiO$_4$:Eu, and so on can be cited.

Next, a blue phosphor contained in the phosphor mixture relating to the present invention will be explained.

As for the blue phosphor, a known blue phosphor having an excitation characteristic and an emission characteristic which will be explained below can be used.

It is a blue phosphor producing bright blue emission with high efficiency having a maximum peak of an emission spectrum within the wavelength range of 440 mm to 500 nm, when a light having wavelength ranges of 250 nm to 420 nm, preferably 300 nm to 420 nm is irradiated as an excitation light. Besides, the half band width of the emission spectrum is preferably 50 nm or more.

As examples of blue phosphors having the above excitation characteristic and the emission characteristic, BAM:Eu (BaMgAl$_{10}$O$_{17}$:Eu), (Sr, Ca, Ba, Mg)$_{10}$(PO$_4$)$_6$Cl$_2$:Eu, and so on can be cited.

As explained above, the red phosphor, the orange phosphor, the green phosphor, and the blue phosphor contained in the phosphor mixture relating to the present invention have 50 nm or more in half band width of the emission spectrum. As a result, the light-emission of the phosphor mixture is a spectrum over all visible light region from blue to red, and it is possible to obtain an emission spectrum exhibiting excellent color rendering when irradiating the phosphor mixture with any excitation light in the wavelength range of 300 nm to 420 nm.

Next, a method of obtaining the phosphor mixture relating to the present invention by mixing the red phosphor, the orange phosphor, the green phosphor, and the blue phosphor will be explained.

When mixing the red phosphor, the orange phosphor, the green phosphor, and the blue phosphor, by setting a mixing ratio, it is possible to set a correlated color temperature of the emission spectrum of obtained light to be a desired value between 7000 K to 2000 K, when the phosphor mixture is irradiated with an excitation light in any wavelength range between 300 nm to 420 nm. Concretely, respective emission spectra against targeted excitation light of the phosphors in respective colors are measured, the obtained emission spectra are composed in simulation, so that a mixing ratio to obtain a desired correlated color temperature can be obtained. Furthermore, since a color rendering, and color coordinate can be obtained in addition to the correlated color temperature, adjustment of the mixing ratio according to these results can be performed. Since the above-described phosphors in respective colors have a half band width of 50 nm or more, respective emission spectra are overlapped with each other in emission of the phosphor mixture, so that the so-called broad, continuous spectrum with no breaks in the wavelength range from 420 nm to 780 nm can be obtained. Moreover, since the phosphors in respective colors have the same range of excitation band, adjustment of the mixture ratio is easy.

However, in a color temperature of, for instance, about 7000 K to about 5000 K, since ratio of blue and green light is high in the emission spectrum itself of the reference light analogous to natural light and ratio of light in the long-wavelength region is low, effect on the evaluation result of color rendering of white light is little in a phosphor to be evaluated, even a red phosphor generating light in the long-wavelength region is small in quantity. On the other hand, in a white light having a color temperature of, for instance, 4500 K or less, since reference light analogous to the natural light has high ratio of light in the long-wavelength region such as orange or red, a red phosphor is inevitably rich, which gives a large effect on a color rendering evaluation result in white light. In short, the phosphor mixture relating to the present invention produces especially good effect in white light in the range of the correlated color temperature from 4500 K to 2000 K.

Further, what is more preferable is that, the emission from the phosphor mixture relating to the present invention has three or more emission peaks in the wavelength range of 420 nm to 780 nm in an emission spectrum of which a correlated color temperature is from 4200 K to 2500 K, and has a continuous spectrum without a break of emission. As a result, it becomes possible to obtain luminance to make human eyesight feel bright as an illumination, and at the same time, can give emission excellent in color rendering since it has a broad emission spectrum in the wavelength range from 420 nm to 780 nm.

Here, an example of manufacturing method of the phosphor relating to the present invention will be explained using an example of producing a red phosphor shown by a composition formula of CaAlSiN$_3$:Eu (where Eu/(Ca+Eu)=0.020). It should be noted that in manufacturing an orange phosphor having other composition formula, it is possible to manufacture it in a similar manner to the case of the red phosphor by making the amount of raw materials supplying respective elements a predetermined ratio.

For respective nitride raw materials for element M, element A and element B, commercially available raw materials can be used, but since the higher in purity the better, materials having 2N or more is preferable, or more preferably 3N or more are prepared. As for the particle size of respective raw material particles, finer particles are generally more preferable from the view point of promoting reaction, but the particle sizes and shapes of obtained phosphors are changed according to the particle sizes and shapes of the raw materials. Therefore, it is enough to prepare nitride raw materials having approximate particle sizes fitting to particle sizes required to the phosphor to be obtained finally. As for a raw material for the Z element, it is preferable to use a commercially available nitride raw material or an element metal, but since the amount of addition is small, there is no problem if oxide is used. The purity is preferably higher similarly to other raw materials, and the material having purity of preferably 2N or more, or more preferably 3N or more is prepared.

In the case of producing Ca$_{0.980}$AlSiN$_3$:Eu$_{0.020}$, it is advisable to prepare, for instance, for the nitrides of element M, element A and element B, Ca$_3$N$_2$ (2N), AlN (3N), and Si$_3$N$_4$ (3N), respectively, and for element Z, EU$_2$O$_3$ (3N).

Then 0.980/3 mol of Ca$_3$N$_2$, 1 mol of AlN, ⅓ mol of Si$_3$N$_4$, and 0.020/2 mol of Eu$_2$O$_3$ are weighed respectively and mixed so that mol ratio of the respective elements is to be Ca:Al:Si:Eu=0.980:1:1:0.020. It is convenient for weighing and mixing to perform in a glove box under inert gas atmosphere since Ca$_3$N$_2$ is susceptive to be oxidized. Since nitrides for the respective raw material elements are easily affected by moisture, it is recommended to use inert gas from which moisture is completely removed. It does not matter whether a wet type or a dry type to be used for the mixing, but if pure water is used as a solvent for wet mixing, the raw materials are decomposed. Therefore, an adequate organic solvent is required to be selected. As for a manufacturing apparatus, an ordinary ball mill and a mortar and the like can be used.

The mixed raw materials are put into a crucible and are kept firing in an inert gas atmosphere such, as nitrogen or the like at 1000° C. or higher, preferably at 1400° C. or higher, or more preferably at 1500° C. or higher, for 30 min or longer, more preferably for 3 hours. Since a higher firing temperature makes the firing faster, the retention time can be reduced. On the other hand, even in the case of a low firing temperature, it is possible to obtain a targeted emission characteristic by keeping the temperature for a long time. However, since the longer the firing time, the more particle-growth progresses, and the particle size gets large, it is necessary to set the firing time according to targeted particle size. As for a crucible, a crucible to be usable in an inert atmosphere such as an Al$_2$O$_3$ crucible, an Si$_3$N$_4$ crucible, an AlN crucible, a SIALON crucible, a C (carbon) crucible, a BN (boron nitride) and the like can be used, and it is preferable to use a BN crucible because the BN crucible can avoid entering impurities from a crucible.

After completion of the firing, the fired product is taken out from the crucible, and phosphor shown by a composition formula Ca$_{0.980}$AlSiN$_3$:Eu$_{0.020}$ can be manufactured by grinding the fired product using a grinding means such as a mortar, ball mill or the like to be a predetermined average particle size. Here, when Eu$_2$O$_3$ is used as a raw material for Eu, oxygen is allowed to enter into the fired product though the amount of oxygen is small so that the composition formula is changed to Ca$_{0.980}$AlSiO$_{0.03}$N$_{2.96}$:Eu$_{0.020}$, but the amount of oxygen is so small that it causes no problem. When further reduction of oxygen is necessary, Eu metal or Eu nitride can be used as an Eu material.

When other elements are used for the element M, element A, element B, and element Z, and when amount of Eu which is an activator is changed, a phosphor can be manufactured using, the same method of manufacture as described above by adjusting the amount of composition at the time of combining respective materials to a predetermined composition ratio.

When the phosphor mixture relating to the present invention is used in a powder, it is preferable that average particle sizes of the respective phosphor powders to be mixed are 20 µm or less respectively. The reason is that since emission by phosphor powders is considered to arise mainly on the surfaces of the powder particles, if the average particle size is 20 µm or less, a surface area per unit weight of the powder for sufficient emission can be secured, and lowering of brightness can be avoided. Furthermore, when illuminations using the phosphor mixture powder are produced, the density of the powder can be made high, when the phosphor mixture powder is made pasty, and apply it, for instance, on a light emitting component or the like by coating. Thus, lowering of the brightness can be avoided. Besides, according to study by the inventors, it is found that more than 0.1

μm in average particle size is desirable from the point of emission efficiency of the phosphor powder, though a detailed-reason is not known. From the above, it is preferable that the average particle size of the phosphor powder relating to the present invention is in the range of 0.1 μm to 20 μm.

Various illuminations, or display devices can be manufactured by combining a powdered phosphor mixture relating to the present invention and a light-emitting section emitting either light in the wavelength range from 250 nm to 420 nm or preferably in the wavelength range from 300 nm to 420 nm. As a light-emitting section, for instance, an LED light-emitting element which produce light in either range from ultraviolet to blue light, or a discharge lamp which emits ultraviolet light can be used. And by combining the phosphor mixture relating to the present invention with the LED light-emitting element, various illumination units and display devices can be manufactured, and by combining the phosphor mixture relating to the present invention with the discharge lamp, various fluorescent lamps, illumination units, and display devices can be manufactured.

Although a method of combining the phosphor mixture relating to the present invention and a light-emitting section can be carried out according to a known method, in the case of a light emitting device using an LED for a light-emitting section, it is possible to prepare a light emitting device as below.

A light emitting device using an LED for a light-emitting section will be explained below referring the drawings.

Figure 4:
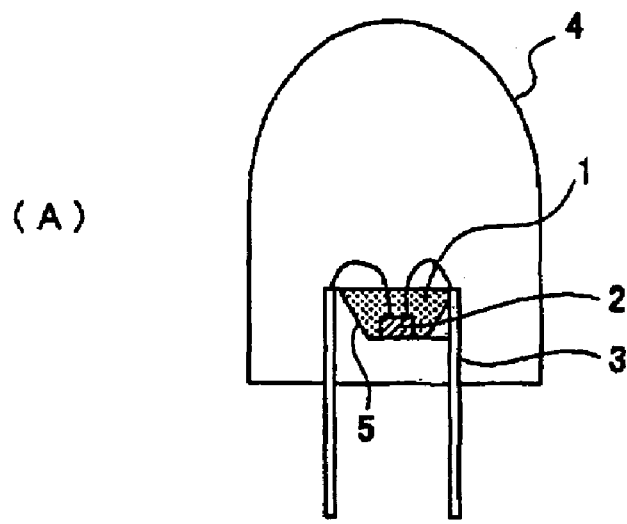
FIGS. 4A, 4B, and 4C are sectional views of a standard type LED according to the embodiments.
Figure 4:
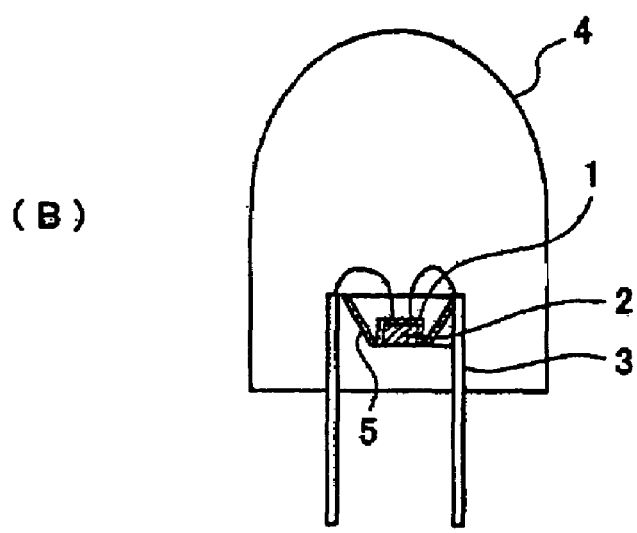
Figure 4:
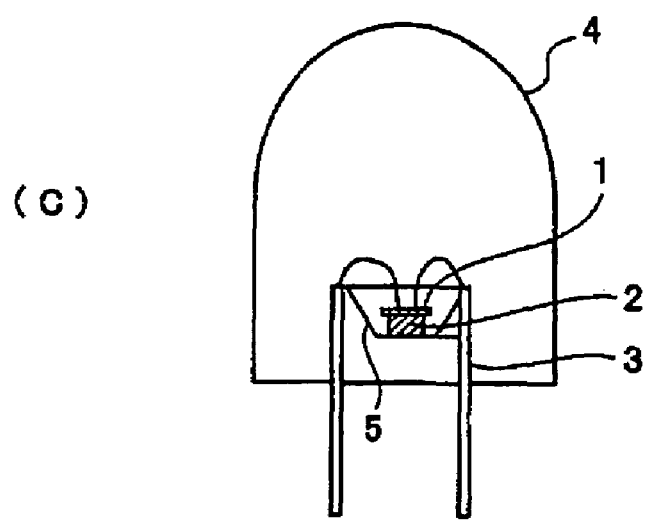

FIGS. 4A to 4C are schematic section views of a standard type LED, and FIGS. 5A to 5E are schematic section views of a reflection type LED. Incidentally, the same symbols and numerals are attached to corresponding portions in the respective drawings, and the explanation thereof will be sometimes restrained.

First, an example of a light emitting device using an LED for a light-emitting section and combining with the phosphor mixture relating to the present invention will be explained using FIG. 4A.

In a standard type LED, an LED light-emitting element 2 is disposed in a cup-shaped vessel 5 provided at a tip of a lead frame 3, and these are molded with a transparent resin 4. In the present embodiment, the phosphor mixture relating to the present invention or a mixture dispersing the phosphor mixture in a transparent resin such as a silicone resin, an epoxy resin, or the like (hereinafter, described as a phosphor mixture 1) is buried in all of a cup-shaped vessel 5.

Next, an example of a different light emitting device will be explained using FIG. 4B.

In the embodiment, a mixture prepared by dispersing the phosphor mixture 1 in a transparent resin such as silicone resin, epoxy resin, or the like is applied on a cup-shaped vessel 5 and a top surface of the LED light-emitting element 2.

Next, an example of a further different light emitting device will be explained using FIG. 4C.

In this embodiment, the phosphor mixture 1 is disposed on an upper portion of the LED light-emitting element 2.

As described above, in the standard type LED light emitting device explained using FIGS. 4(A) to 4(C), the direction of emission from the LED light-emitting element 2 is upward, but it is possible to prepare a light emitting device which emits light downward in a similar way. For instance, a reflection type LED emits light outside by disposing a reflecting plane or a reflecting plate in an emitting direction of light from the LED light-emitting element, and allowing light emitted from the light-emitting element to reflect on the reflecting plate. Then, an example of a light emitting device combining a reflection type LED with the phosphor mixture relating to the present invention will be explained using FIGS. 5A to 5E.

Figure 5:
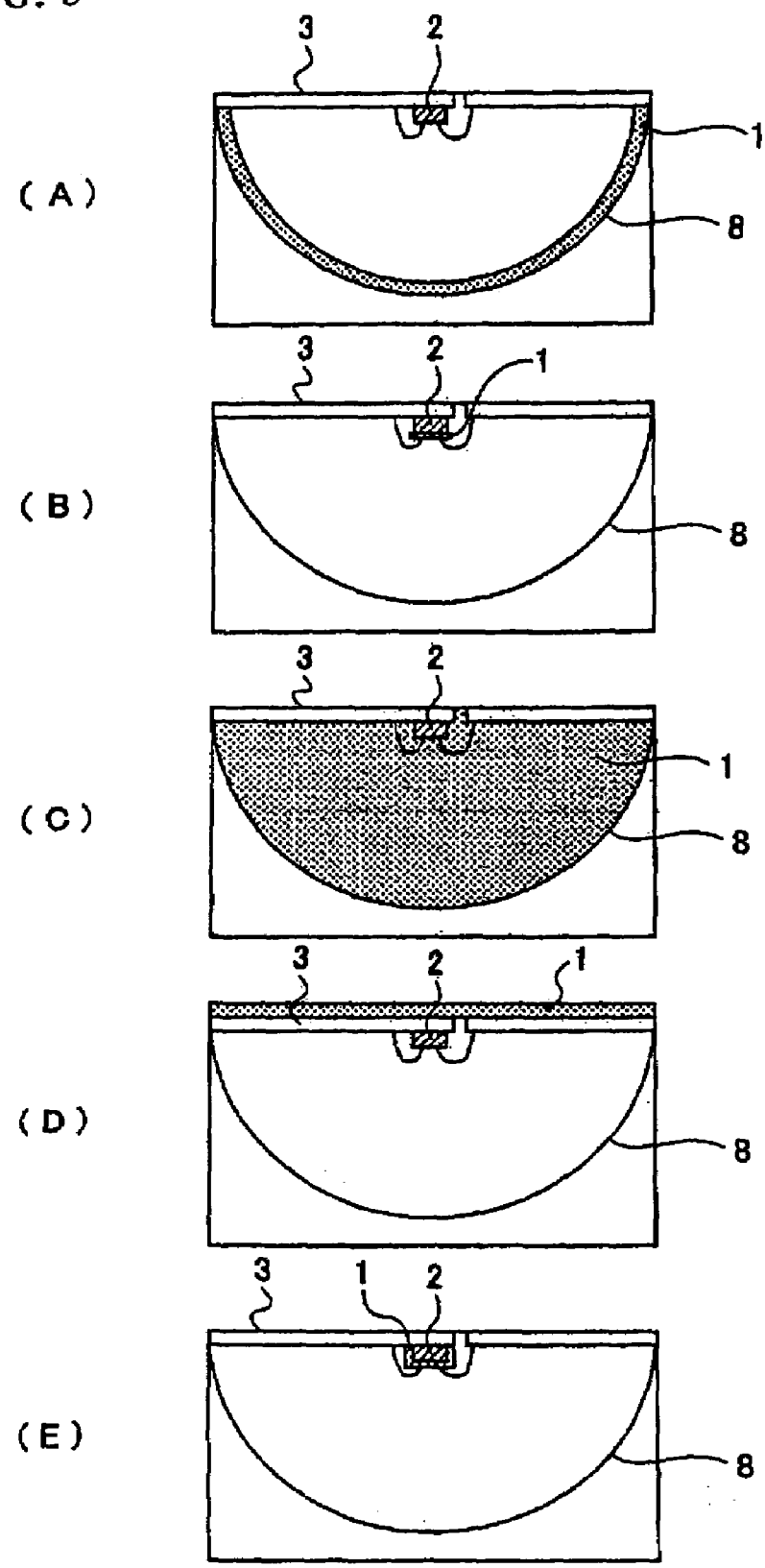
FIGS. 5A, 5B, 5C, 5D, and 5E are sectional views of a reflection type LED according to the embodiments.

First, an example of a light emitting device which uses a reflection type LED for a light-emitting section and combines it with the phosphor mixture relating to the present invention will be explained using FIG. 5A.

In the reflection type LED, the LED light-emitting element 2 is disposed at a tip of one of lead frames 3, and lights emitting from the LED light-emitting element go downward, reflect by a reflecting plate 8 and emit from an upper portion. In the present embodiment, the phosphor mixture 1 is applied by coating on the reflecting surface 8. Note that a transparent molding material is sometimes filled in a recessed portion formed by the reflecting plate 8 for protecting the LED light-emitting element 2.

Next, an example of a still different light emitting device will be explained using FIG. 5B.

In this embodiment, the phosphor mixture 1 is disposed on a lower portion of the LED light-emitting element 2.

Next, an example of a still different light emitting device will be explained using FIG. 5C.

In this embodiment, the phosphor mixture 1 is filled in a recessed portion formed by the reflecting plate 8.

Next, an example of a still different light emitting device will be explained using FIG. 5D.

In this embodiment, the phosphor mixture 1 is applied on an upper portion of the transparent molding material by coating for protecting the LED light-emitting element 2.

Next, an example of a still different light emitting device will be explained using FIG. 5E.

In this embodiment, the phosphor mixture 1 is applied on the surface of the LED light-emitting element 2 by coating.

The standard type LIED and the reflection type LED can be put to proper use according to usages, but the reflection type LED has merits of making the thickness thin, making the emission area large, making the utilization efficiency of light high, and the like.

Since the light source is required to have an emission spectrum excellent in color rendering when the above-explained light source is used as a light source for general-purpose illumination, color rendering of a light source in which the phosphor mixture relating to the present invention is incorporated is evaluated using an evaluation method according to JIS Z 8726. If an general color rendering index Ra of the light source in evaluation is found to be 80 or more based on JIS Z 8726 test, it can be said to be an excellent light source. And when a special color rendering index R9 which is an index showing a red component is preferably 60 or more, and more preferably a special color rendering index R15 which is an index showing a flesh color of a Japanese woman is 80 or more, it can be said to be a very excellent light source.

Then, a light emitting device in which light from a light-emitting section produce any light in the wavelength range from 300 nm to 420 nm was irradiated to the phosphor mixture relating to the present invention, and the phosphor mixture producing emission was prepared. Incidentally, an LED was used as a light-emitting section.

A color rendering property of light emitted by the light emitting device was evaluated. As a result, a color rendering of the light source in which the phosphor mixture relating to the present invention was incorporated could easily realize a light source showing 80 or more in Ra, 60 or more in R9, and 80 or more in R15 in the correlated color temperature range from 7000 K to 2500 K. And the light emitting device showed extremely high color rendering of 90 or more in Ra, 95 or more in R9, 96 or more in R15 in the correlated color temperature range of 4000 K to 2600 K by appropriately adjusting the mixing ratio of the phosphors, which turned out that the light emitting device is a very excellent light source.

Furthermore, in the phosphor mixture relating to the present invention, variously colored emitting light not obtainable hitherto can be obtained by suitably changing the amount of composition of four kinds of the phosphors.

EXAMPLE

The present invention will be explained more concretely based on the examples below.

Example 1

In example 1, when excited by a light-emitting element (LED) emitting light having an emission spectrum having a peak wavelength at 390 nm, a phosphor mixture producing emission at the correlated color temperature of 5000 K was prepared, and emission characteristics and color rendering of the phosphor mixture was evaluated.

1) Preparation of Phosphors

A red phosphor $CaAlSiN_3$:Eu was manufactured by the method explained in the embodiments.

An orange phosphor $CaAl_2Si_4N_8$:Eu was manufactured in the same way as the red phosphor $CaAlSiN_3$:Eu, except formulation ratio of raw materials of 0.950/3 mol of $Ca_3N_2$, 2 mol of AlN, 4/3 mol of $Si_3N_4$ and 0.050/2 mol of $Eu_2O_3$.

For a green phosphor ZnS:Cu,Al and a blue phosphor BAM:Eu, commercially available products were prepared.

2) Formulation of a Phosphor Mixture

An emission spectrum created by exciting the above-described four kinds of phosphors which were $CaAlSiN_3$:Eu, $CaAl_2Si_4N_8$:Eu, ZnS:CuAl and BAM:Eu with excitation light having an emission spectrum having a peak wavelength at 390 nm was measured. From the emission spectrum, a relative mixing ratio with which a correlated color temperature of the phosphor mixture becomes 5000 K was found by simulation. Since the result of the simulation was $CaAlSiN_3$:Eu:$CaAl_2Si_4N_8$:Eu:ZnS:CuA BAM:Eu=0.07:0.07:0.36:0.51, a phosphor mixture was obtained by weighing and mixing the respective phosphors based on the simulation result.

Here, when being excited by the excitation light having an emission spectrum having a peak wavelength at 390 nm, the half band width of the emission spectrum of $CaAlSiN_3$:Eu was 86.7 nm, the half band width of the emission spectrum of $CaAl_2Si_4N_8$:Eu was 85.2 nm, the half band width of the emission spectrum of ZnS:Cu,Al was 75.0 nm, and the half band width of the emission spectrum of BAM:Eu was 53.5 nm, which means an are 50 nm or more.

However, a preferable mixing ratio is sometimes deviated from the result of the simulation due to an emission wavelength of the light-emitting section (excitation wavelength of the phosphor mixture) and emission efficiency of the phosphor by the emission wavelength. In such a case, it is advisable to adjust an actual shape of the emission spectrum by suitably adjusting the composition ratio of the phosphors.

3) Evaluation of Emission Characteristics

Light having an emission spectrum having a peak wavelength at 390 nm was irradiated as an excitation light to the phosphor mixture thus obtained and a correlated color temperature of the emission by the phosphor mixture was measured. The measurement result was 4998 K, and the phosphor mixture was found to have a targeted color temperature. Furthermore, the chromaticity of the emission was measured as below.

x=0.346, and y=0.358.

The obtained emission spectrum is shown by a solid line in FIG. 1. Note that FIG. 1 is a graph in which the vertical axis is relative emission intensity, and the horizontal axis is an emission wavelength (nm).

The emission spectrum had a continuous spectrum without breaks in the wavelength range from 420 nm to 780 nm and had three emission peaks in the wavelength range from 420 nm to 780 nm.

4) Evaluation of Color Rendering

Evaluation of color rendering in the light emission of the phosphor mixture was carried out in accordance with JIS Z 8726. All evaluation values were 80 or more as shown in the following values that the general color rendering index Ra, the special color rendering index R9, R10, R11, R12, R13, R14, and R15 were 95, 98, 85, 94, 80, 95, 94, and 97 respectively, and especially R9 and R15 were 90 or more, exhibiting very excellent color rendering.

A listing of measurement data of example 1, and examples 2 and 3 is described in Table 1, in which examples 2 and 3 will be described later.

Example 2

Also in example 2, a phosphor mixture producing emission at a correlated color temperature of 5000 K was manufactured, and emission characteristics and color rendering of the phosphor mixture were evaluated.

1). Preparation of Phosphors

A red phosphor $CaAlSiN_3$:Eu was manufactured by the method explained in the embodiments.

An orange phosphor $2.75SrO.Si_3N_4$:Eu was manufactured in the same way as the red phosphor $CaAlSiN_3$:Eu, except formulation ratio of raw materials of 2.71 mol of $SrCO_3$, 1 mol of $Si_3N_4$, and 0.040/2 mol of $Eu_2O_3$.

For a green phosphor ZnS:Cu,Al and a blue phosphor BAM:Eu, commercially available products were prepared.

2) Formulation of a Phosphor Mixture

In the same way as in example 1, $CaAlSiN_3$:Eu2.75SrO $Si_3N_4$:Eu:ZnS:Cu,Al:BAM:Eu=0.01:0.16:0.38:0.45 was found, and a phosphor mixture was obtained by weighing and mixing the respective phosphors according to the result.

Here, when being excited by the excitation light having an emission spectrum having a peak wavelength at 390 nm, the half band width of the emission spectrum of $2.75SrO.Si_3N_4$:Eu was 94.0 nm.

3) Evaluation of Emission Characteristics

In the same way as in example 1, the correlated color temperature of emission of the phosphor mixture measured was 4998 K, and the phosphor mixture was found to have a targeted color temperature. Furthermore, the chromaticity of the emission was measured as below x=0.346, and y=0.359.

The obtained emission spectrum is shown by a dashed line in FIG. 1.

Similarly to those in example 1, the emission spectrum had a continuous spectrum without breaks in the wavelength range from 420 nm to 780 nm and had three emission peaks in the wavelength range from 420 nm to 780 nm.

4) Evaluation of Color Rendering

Evaluation of color rendering was carried out in the same way as in example 1. All evaluation values were 80 or more as shown in the following values that the general color rendering index Ra, the special color rendering index R9, R10, R11, R12, R13, R14, and R15 were 96, 96, 95, 89, 88, 96, 94, and 97 respectively, and especially R9 and R15 were 90 or more, exhibiting very excellent color rendering.

Example 3

Also in example 3, a phosphor mixture producing emission at a correlated color temperature of 5000 K was manufactured, and emission characteristics and color rendering of the phosphor mixture were evaluated.

1). Preparation of Phosphors

A red phosphor $CaAlSiN_3$:Eu was manufactured by the method explained in the embodiments.

An orange phosphor $Ca_2Si_5N_8$:Eu was manufactured in the same way as the red phosphor $CaAlSiN_3$:Eu, except formulation ratio of raw materials of 1.98/3 mol of $Ca_3N_2$, 5/3 mol of $Si_3N_4$, and 0.020/2 mol of $Eu_2O_3$.

For a green phosphor ZnS:Cu,Al and a blue phosphor BAM:Eu, commercially available products were prepared.

2) Formulation of a Phosphor Mixture

In the same way as in example 1, $CaAlSiN_3$:Eu:$Ca_2Si_5N_8$:Eu ZnS:Cu,Al:BAM:Eu=0.04:0.17:0.31:0.48 was found, and a phosphor mixture was obtained by weighing and mixing the respective phosphors according to the result.

Here, when being excited by the excitation light having an emission spectrum having a peak wavelength at 390 nm, the half band width of the emission spectrum of $Ca_2Si_5N_8$:Eu was 98.7 nm.

3) Evaluation of Emission Characteristics

In the same way as in example 1, the correlated color temperature of emission of the phosphor mixture measured was 5012 K, and the phosphor mixture was found to have a targeted color temperature. Furthermore, the chromaticity of the emission was measured as below.

x=0.345, and y=0.358.

The obtained emission spectrum is shown by a broken line in FIG. 1.

Similarly to those in example 1, the emission spectrum had a continuous spectrum without breaks in the wavelength range from 420 nm to 780 nm and had three emission peaks in the wavelength range from 420 nm to 780 nm.

4) Evaluation of Color Rendering

Evaluation of color rendering was carried out in the same way as in example 1. All evaluation values were 80 or more as shown in the following values that the general color rendering, index Ra, the special color rendering index R9, R10, R11, R12, R13, R14, and R15 were 96, 97, 90, 93, 89, 98, 96, and 98 respectively, and especially R9 and R15 were 90 or more, exhibiting very excellent color rendering.

Table 1

Example 4

In example 4, a phosphor mixture producing emission at a correlated color temperature of 4200 K was manufactured, and emission characteristics and color rendering of the phosphor mixture were evaluated.

1) Preparation of Phosphors

The red phosphor, the orange phosphor, the green phosphor, and the blue phosphor similar to those in example 1 were prepared.

2) Formulation of a Phosphor Mixture

In the same way as in example 1, a relative mixing ratio with which a correlated color temperature of the emission spectrum of the phosphor mixture when excited by excitation light having an emission spectrum having a peak wavelength at 390 nm becomes 4200 K was found to be $CaAlSiN_3$:Eu:$CaAl_2Si_4N_8$:Eu:ZnS:Cu,Al:BAM:Eu=0.07:0.09:0.38:0.45, and a phosphor mixture was obtained by weighing and mixing the respective phosphors according to the result.

3) Evaluation of Emission Characteristics

In the same way as in example 1, the correlated color temperature of emission of the phosphor mixture measured was 4197 K, and the phosphor mixture was found to have a targeted color temperature. Furthermore, the chromaticity of the emission was measured as below.

x=0.374, and y=0.378.

Figure 2:
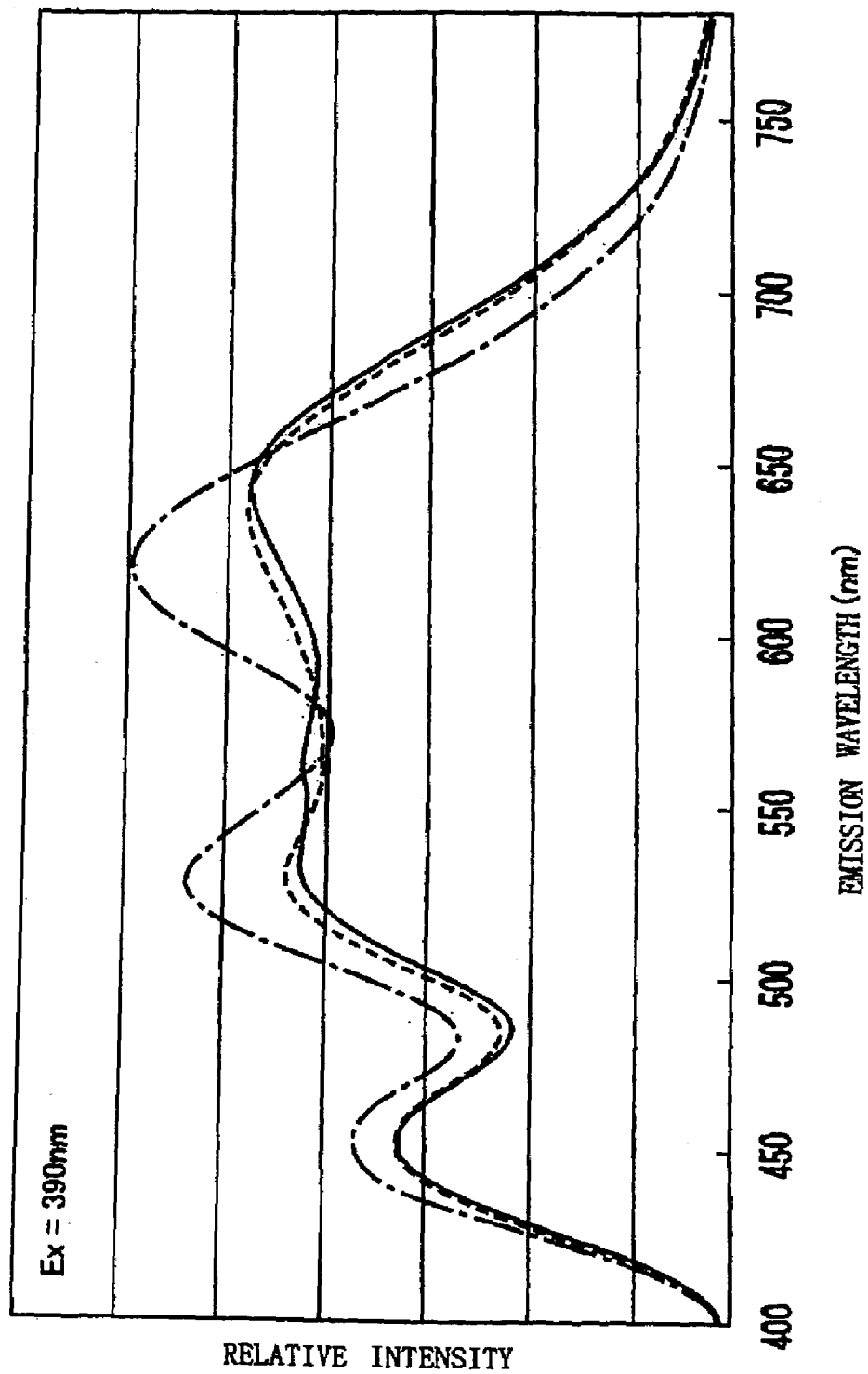
FIG. 2 shows the emission spectrum pattern of the phosphor mixture according to the embodiment, when the correlated color temperature is set to be 4200K.

The obtained emission spectrum is shown by a solid line in FIG. 2.

Similarly to those in example 1, the emission spectrum had a continuous spectrum without breaks in the wavelength range from 420 nm to 780 nm and had three emission peaks in the wavelength range from 420 nm to 780 nm.

4) Evaluation of Color Rendering

Evaluation of color rendering was carried out in the same way as in example 1. All evaluation values were 80 or more as shown in the following values that the general color rendering index Ra, the special color rendering index R9, R10, R11, R12, R13, R14, and R15 were 95, 96, 87, 95, 82, 96, 95, and 97 respectively, and especially R9 and R15 were 90 or more, exhibiting very excellent color rendering.

A listing of measurement data of example 4, and examples 5 and 6 is described in Table 2, in which examples 5 and 6 will be described later.

Example 5

Also in example 5, a phosphor mixture producing emission at a correlated color temperature of 4200 K was manufactured, and emission characteristics and color rendering of the phosphor mixture were evaluated.

1) Preparation of Phosphors

The red phosphor, the orange phosphor, the green phosphor, and the blue phosphor similar to those in example 2 were prepared.

2) Formulation of a Phosphor Mixture

In the same way as in example 1, a relative mixing ratio with which a correlated color temperature of the emission spectrum of the phosphor mixture when excited by excitation light having an emission spectrum having a peak wavelength at 390 nm becomes 4200 K was found to be $CaAlSiN_3$:Eu:$2.75SrO.Si_3N_4$:Eu:ZnS:Cu,Al:BAM:Eu=0.02:0.19:0.40:0.39, and a phosphor mixture was obtained by weighing and mixing the respective phosphors according to the result.

3) Evaluation of Emission Characteristics

In the same way as in example 1, the correlated color temperature of emission of the phosphor mixture measured was 4202 K, and the phosphor mixture was found to have a targeted color temperature. Furthermore, the chromaticity of the emission was measured as below.

x=0.374, and y=0.378.

The obtained emission spectrum is shown by a dashed line in FIG. 2.

Similarly to those in example 1, the emission spectrum had a continuous spectrum without breaks in the wavelength range from 420 nm to 780 nm and had three emission peaks in the wavelength range from 420 nm to 780 nm.

4) Evaluation of Color Rendering

Evaluation of color rendering was carried out in the same way as in example 1. All evaluation values were 80 or more as shown in the following values that the general color rendering index Ra, the special color rendering index R9, R10, R11, R12, R13, R14, and R15 were 95, 95, 98, 86, 93, 95, 95, and 96 respectively, and especially R9 and R15 were 90 or more, exhibiting very excellent color rendering.

Example 6

Also in example 6, a phosphor mixture producing emission at a correlated color temperature of 4200 K was manufactured, and emission characteristics and color rendering of the phosphor mixture were evaluated.

1). Preparation of Phosphors

The red phosphor, the orange phosphor, the green phosphor, and the blue phosphor similar to those in example 3 were prepared.

2) Formulation of a Phosphor Mixture

In the same way as in example 1, a relative mixing ratio with which a correlated color temperature of the emission spectrum of the phosphor mixture when excited by excitation light having an emission spectrum having a peak wavelength at 390 nm becomes 4200 K was found to be $CaAlSiN_3:Eu:Ca_2Si_5N_8:Eu:ZnS:Cu,Al:BAM:Eu=0.05: 0.21:0.32:0.41$, and a phosphor mixture was obtained by weighing and mixing the respective phosphors according to the result.

3) Evaluation of Emission Characteristics

In the same way as in example 1, the correlated color temperature of emission of the phosphor mixture measured was 4202 K, and the phosphor mixture was found to have a targeted color temperature. Furthermore, the chromaticity of the light emission was measured as below.

x=0.374, and y=0.378.

The obtained emission spectrum is shown by a broken line in FIG. 2.

Similarly to those in example 1, the emission spectrum had a continuous spectrum without breaks in the wavelength range from 420 nm to 780 nm and had three emission peaks in the wavelength range from 420 nm to 780 nm.

4) Evaluation of Color Rendering

Evaluation of color rendering was carried out in the same way as in example 1. All evaluation values were 80 or more as shown in the following values that the general color rendering index Ra, the special color rendering index R9, R10, R11, R12, R13, R14, and R15 were 96, 99, 91, 94, 86, 98, 95, and 99 respectively, and especially R9 and R15 were 90 or more, exhibiting very excellent color rendering.

Table 2

Example 7

In example 7, a phosphor mixture producing emission at a correlated color temperature of 3000 K was manufactured, and emission characteristics and color rendering of the phosphor mixture were evaluated.

1) Preparation of Phosphors

The red phosphor, the orange phosphor, the green phosphor, and the blue phosphor similar to those in example 1 were prepared.

2) Formulation of a Phosphor Mixture

In the same way as in example 1, a relative mixing ratio with which a correlated color temperature of the emission spectrum of the phosphor mixture when excited by excitation light having an emission spectrum having a peak wavelength at 390 nm becomes 3000 K was found to be $CaAlSiN_3:Eu:CaAl_2Si_4N_8:Eu:ZnS:Cu,Al:BAM:Eu=0.12: 0.16:0.39:0.33$, and a phosphor mixture was obtained by weighing and mixing the respective phosphors according to the result.

3) Evaluation of Emission Characteristics

In the same way as in example 1, the correlated color temperature of emission of the phosphor mixture measured was 3000 K, and the phosphor mixture was found to have a targeted color temperature. Furthermore, the chromaticity of the emission was measured as below.

x=0.436, and y=0.403.

The obtained emission spectrum is shown by a solid line in FIG. 2.

Similarly to those in example 1, the emission spectrum had a continuous spectrum without breaks in the wavelength range from 420 nm to 780 nm and had three emission peaks in the wavelength range from 420 nm to 780 mm.

4) Evaluation of Color Rendering

Evaluation of color rendering was carried out in the same way as in example 1. All evaluation values were 80 or more as shown in the following values that the general color rendering index Ra, the special color rendering index R9, R10, R11, R12, R13, R14, and R15 were 97, 96, 95, 94, 94, 100, 96, and 99 respectively, and especially R9 and R15 were 90 or more, exhibiting very excellent color rendering.

A listing of measurement data of example 7, and examples 8 and 9 is described in Table 3, in which examples 8 and 9 will be described later.

Example 8

Also in example 8, a phosphor mixture producing emission at a correlated color temperature of 3000 K was manufactured, and emission characteristics and color rendering of the phosphor mixture were evaluated.

1). Preparation of Phosphors

The red phosphor, the orange phosphor, the green phosphor, and the blue phosphor similar to those in example 2 were prepared.

2) Formulation of a Phosphor Mixture

In the same way as in example 1, a relative mixing ratio with which a correlated color temperature of the emission spectrum of the phosphor mixture when excited by excitation light having an emission spectrum having a peak wavelength at 390 nm becomes 3000 K was found to be $CaAlSiN_3:Eu:2.75SrO.Si_3N_4:Eu:ZnS:Cu,Al:BAM: Eu=0.03:0.30:0.41:0.26$, and a phosphor mixture was obtained by weighing and mixing the respective phosphors according to the result.

3) Evaluation of Emission Characteristics

In, the same way as in example 1, the correlated color temperature of emission of the phosphor mixture measured was 2996 K, and the phosphor mixture was found to have a targeted color temperature. Furthermore, the chromaticity of the emission was measured as below.

x=0.437, and y=0.403.

Figure 3:
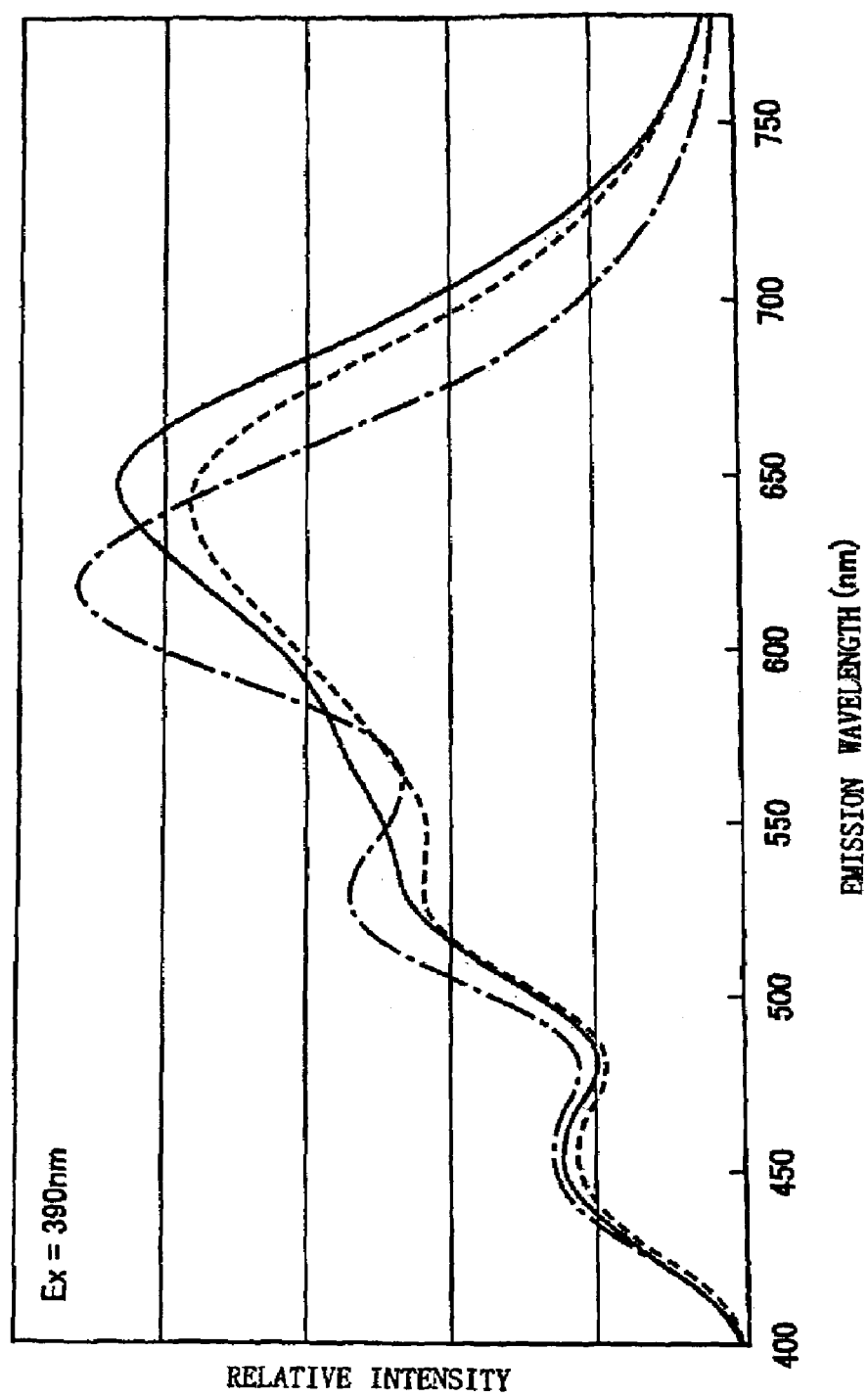
FIG. 3 shows the emission spectrum pattern of the phosphor mixture according to the embodiment, when the correlated color temperature is set to be 3000 K.

The obtained emission spectrum is shown by a dashed line in FIG. 3.

Similarly to those in example 1, the emission spectrum had a continuous spectrum without breaks in the wavelength range from 420 nm to 780 nm and had three emission peaks in the wavelength range from 420 nm to 780 nm.

4) Evaluation of Color Rendering

Evaluation of color rendering was carried out in the same way as in example 1. All evaluation values were 0.80 or more as shown in the following values that the general color rendering index Ra, the special color rendering index R9, R10, R11, R12, R13, R14, and R15 were 93, 96, 92, 80, 90, 90, 97, and 96 respectively, and especially R9 and R15 were 90 or more, exhibiting very excellent color rendering.

Example 9

Also in example 9, a phosphor mixture producing emission at a correlated color temperature of 3000 K was manufactured, and emission characteristics and color rendering of the phosphor mixture were evaluated.

1). Preparation of Phosphors

The red phosphor, the orange phosphor, the green phosphor, and the blue phosphor similar to those in example 1 were prepared.

2) Formulation of a Phosphor Mixture

In the same way as in example 1, a relative mixing ratio with which a correlated color temperature of the emission spectrum of the phosphor mixture when excited by excitation light having an emission spectrum having a peak wavelength at 390 nm becomes 3000 K was found to be $CaAlSiN_3:Eu:Ca_2Si_5N_8:Eu:ZnS:CuAl:BAM:Eu=0.09:0.31:0.32:0.27$, and a phosphor mixture was obtained by weighing and mixing the respective phosphors according to the result.

3) Evaluation of Emission Characteristics

In the same way as in example 1, the correlated color temperature of emission of the phosphor mixture measured was 3001 K, and the phosphor mixture was found to have a targeted color temperature. Furthermore, the chromaticity of the emission was measured as below.

x=0.436, and y=0.403.

The obtained emission spectrum is shown by a broken line in FIG. 3.

Similarly to those in example 1, the emission spectrum had a continuous spectrum without breaks in the wavelength range from 420 nm to 780 nm and had three emission peaks in the wavelength range from 420 nm to 780 nm.

4) Evaluation of Color Rendering

Evaluation of color rendering was carried out in the same way as in example 1. All evaluation values were 80 or more as shown in the following values that the general color rendering index Ra, the special color rendering index R9, R10, R11, R12, R13, R14, and R15 were 98, 98, 99, 91, 98, 98, 97, and 99 respectively, and especially R9 and R15 were 90 or more, exhibiting very excellent color rendering.

Table 3

TABLE 1

Ex = 390 nm

| Example | Phosphor Composition Formula | | | | Relative Mixing Ratio | | | |
|---|---|---|---|---|---|---|---|---|
| | Red | Orange | Green | Blue | Red | Orange | Green | Blue |
| 1 | $CaAlSiN_3$: Eu | $CaAi_2Si_4N_8$: Eu | ZnS: Cu, Al | BAM: Eu | 0.07 | 0.07 | 0.36 | 0.51 |
| 2 | $CaAlSiN_3$: Eu | $2.75SrO.Si_3N_4$: Eu | ZnS: Cu, Al | BAM: Eu | 0.01 | 0.16 | 0.38 | 0.45 |
| 3 | $CaAlSiN_3$: Eu | $Ca_2Si_5N_8$: Eu | ZnS: Cu, Al | BAM: Eu | 0.04 | 0.17 | 0.31 | 0.48 |

| Example | Correlated Color Temperature Tcp (K) | Chromaticity x | y | General Color Rendering Index Ra | Special Color Rendering Index | | | | | | |
|---|---|---|---|---|---|---|---|---|---|---|---|
| | | | | | R9 | R10 | R11 | R12 | R13 | R14 | R15 |
| 1 | 4998 | 0.346 | 0.358 | 95 | 98 | 85 | 94 | 80 | 95 | 94 | 97 |
| 2 | 4998 | 0.346 | 0.359 | 96 | 96 | 95 | 89 | 88 | 96 | 94 | 97 |
| 3 | 5012 | 0.345 | 0.358 | 96 | 97 | 90 | 93 | 89 | 98 | 96 | 98 |

TABLE 2

Ex = 390 nm

| Example | Phosphor Composition Formula | | | | Relative Mixing Ratio | | | |
|---|---|---|---|---|---|---|---|---|
| | Red | Orange | Green | Blue | Red | Orange | Green | Blue |
| 4 | $CaAlSiN_3$: Eu | $CaAi_2Si_4N_8$: Eu | ZnS: Cu, Al | BAM: Eu | 0.07 | 0.09 | 0.38 | 0.45 |
| 5 | $CaAlSiN_3$: Eu | $2.75SrO.Si_3N_4$: Eu | ZnS: Cu, Al | BAM: Eu | 0.02 | 0.19 | 0.40 | 0.39 |
| 6 | $CaAlSiN_3$: Eu | $Ca_2Si_5N_8$: Eu | ZnS: Cu, Al | BAM: Eu | 0.05 | 0.21 | 0.32 | 0.41 |

| Example | Correlated Color Temperature Tcp (K) | Chromaticity x | y | General Color Rendering Index Ra | Special Color Rendering Index | | | | | | |
|---|---|---|---|---|---|---|---|---|---|---|---|
| | | | | | R9 | R10 | R11 | R12 | R13 | R14 | R15 |
| 4 | 4197 | 0.374 | 0.378 | 95 | 96 | 87 | 95 | 82 | 96 | 95 | 97 |
| 5 | 4202 | 0.374 | 0.378 | 95 | 95 | 98 | 86 | 93 | 95 | 95 | 96 |
| 6 | 4202 | 0.374 | 0.378 | 96 | 99 | 91 | 94 | 86 | 98 | 95 | 99 |

TABLE 3

Ex = 390 nm

| | Phosphor Composition Formula | | | | Relative Mixing Ratio | | | |
|---|---|---|---|---|---|---|---|---|
| Example | Red | Orange | Green | Blue | Red | Orange | Green | Blue |
| 7 | CaAlSiN$_3$: Eu | CaAi$_2$Si$_4$N$_8$: Eu | ZnS: Cu, Al | BAM: Eu | 0.12 | 0.16 | 0.39 | 0.33 |
| 8 | CaAlSiN$_3$: Eu | 2.75SrO.Si$_3$N$_4$: Eu | ZnS: Cu, Al | BAM: Eu | 0.03 | 0.30 | 0.41 | 0.26 |
| 9 | CaAlSiN$_3$: Eu | Ca$_2$Si$_5$N$_8$: Eu | ZnS: Cu, Al | BAM: Eu | 0.09 | 0.31 | 0.32 | 0.27 |

| | Correlated Color Temperature | Chromaticity | | General Color Rendering Index | Special Color Rendering Index | | | | | | |
|---|---|---|---|---|---|---|---|---|---|---|---|
| Example | Tcp (K) | x | y | Ra | R9 | R10 | R11 | R12 | R13 | R14 | R15 |
| 7 | 3000 | 0.436 | 0.403 | 97 | 96 | 95 | 94 | 94 | 100 | 96 | 99 |
| 8 | 2996 | 0.437 | 0.403 | 93 | 96 | 92 | 80 | 90 | 90 | 97 | 96 |
| 9 | 3001 | 0.436 | 0.403 | 98 | 98 | 99 | 91 | 98 | 98 | 97 | 99 |

What is claimed is:

1. A phosphor mixture, comprising:
a red phosphor expressed by a composition formula of MmAaBbOoNn:Z (where an element M indicates one or more kinds of elements having a valency of II, an element A indicates one or more kinds of elements having a valency of III, an element B indicates one or more kinds of elements having a valency of IV, O indicates oxygen, N indicates nitrogen, an element Z indicates elements serving as an activator in the phosphors, and m=a=b=1, o<0.5, n=3−$\frac{2}{3}$o);
an orange phosphor having a maximum peak of an emission spectrum in the wavelength range of 570 to 630 nm;
a green phosphor having a maximum peak of the emission spectrum in the wavelength range of 500 to 570 nm; and
a blue phosphor having a maximum peak of the emission spectrum in the wavelength range of 440 to 500 nm.

2. The phosphor mixture according to claim 1, wherein said orange phosphor is a phosphor expressed by a composition formula of MmAaBbOoNn:Z (where an element M indicates one or more kinds of elements having a valency of II, an element A indicates one or more kinds of elements having a valency of III, an element B indicates one or more kinds of elements having a valency of IV, O indicates oxygen, N indicates nitrogen, an element Z indicates elements serving as an activator in the above-described phosphors, and n=$\frac{2}{3}$m+a+$\frac{4}{3}$b−$\frac{2}{3}$o (m>0, a≧0, b>0, o≧0).

3. The phosphor mixture according to claim 1, wherein said orange phosphor is a phosphor expressed by a composition formula of MmAaBbOoNn:Z (where an element M indicates elements consisting of one or more kinds of elements having a valency of II, an element A indicates one or more kinds of elements having a valency of III, an element B indicates one or more kinds of elements having a valency of IV, O indicates oxygen, N indicates nitrogen, an element Z indicates elements serving as an activator in the above-described phosphors, and m=1.0, a=2.0, 3.0≦b≦6.0, o<1.0, n=$\frac{8}{3}$+$\frac{4}{3}$b−$\frac{2}{3}$o).

4. The phosphor mixture according to claim 1, wherein said element M comprises one or more kinds of elements selected from Ca, Mg, Sr, Ba, and Zn;
said element A comprises one or more kinds of elements selected from Al and Ga;
said element B comprises one or more kinds of elements selected from Si and Ge; and
said element Z comprises one or more kinds of elements selected from a group consisting of rare earth elements or transition metal elements.

5. The phosphor mixture according to claim 1, wherein said element Z comprises Eu.

6. The phosphor mixture according to claim 1, wherein each of said respective phosphors has a half band width of 50 nm or more in the emission spectrum.

7. The phosphor mixture according to claim 1, wherein said phosphor mixture includes a spectrum having a correlated color temperature in the range of 7000 K to 2000 K and being continuous in the wavelength range of 420 nm to 780 nm without breaks in the emission spectrum excited by exciting light in the wavelength range of 300 nm to 420 nm.

8. The phosphor mixture according to claim 1, wherein said phosphor mixture includes a spectrum having a correlated color temperature in the range of 4500 K to 2000 K, having three or more of emission peak in the wavelength range of 420 nm to 780 nm, and being continuous in the wavelength range of 420 nm to 780 nm without breaks in the emission spectrum excited by exciting light in the wavelength range of 300 nm to 420 nm.

9. The phosphor mixture according to claim 1, wherein said green phosphor comprises ZnS:Cu, Al, and/or (Ba, Sr, Ca)$_2$SiO$_4$:Eu.

10. The phosphor mixture according to claim 1, wherein said blue phosphor comprises BAM:Eu (BaMgAl$_{10}$O$_{17}$:Eu) and/or (Sr, Ca, Ba, Mg)$_{10}$(PO$_4$)$_6$Cl$_2$:Eu.

11. The phosphor mixture according to claim 1, wherein each of said respective phosphors comprises particles having an average particle size of 0.1 μm to 20 μm.

12. A light emitting device, comprising:
the phosphor mixture according to claim 1; and
a light-emitting section producing emission having any wavelength in the wavelength range of 300 nm to 420 nm.

13. The light emitting device according to claim 12, wherein the general color rendering index Ra of said light emitting device is 80 or more.

14. The light emitting device according to claim 12, wherein the special color rendering index R9 of said light emitting device is 60 or more.

15. The light emitting device according to claim 12, wherein the special color rendering index R15 of said light emitting device is 80 or more.

16. The light emitting device according to claim 12, wherein a correlated color temperature of said light emitting device is in the range of 7000 K to 2500 K.

17. The light emitting device according to claim 12, wherein a correlated color temperature of said light emitting device is in the range of 4500 K to 2500 K.

18. The light emitting device according to claim 12, wherein said light-emitting section comprises a light-emitting diode (LED).

* * * * *